United States Patent
Van Veenendaal

[19]

[11] Patent Number: 6,097,258
[45] Date of Patent: Aug. 1, 2000

[54] OSCILLATOR HAVING A RESONATOR COUPLED TO AN AMPLIFIER BY A SERIES RESISTANCE

[75] Inventor: Hendrik G. Van Veenendaal, Eindhoven, Netherlands

[73] Assignee: U.S. Philips Corporation, New York, N.Y.

[21] Appl. No.: 09/159,989

[22] Filed: Sep. 24, 1998

[30] Foreign Application Priority Data

Sep. 30, 1997 [EP] European Pat. Off. .............. 97203021

[51] Int. Cl.[7] ........................................ H03B 5/12
[52] U.S. Cl. .................. 331/117 R; 331/167; 331/177 V
[58] Field of Search .......................... 331/116 R, 116 FE, 331/117 R, 117 FE, 158, 167, 177 V

[56] References Cited

U.S. PATENT DOCUMENTS 4,350,971 9/1982 Forrester et al. .................. 331/177 FE
5,434,544 7/1995 Van Veenendaal .................. 331/117 R

FOREIGN PATENT DOCUMENTS 2228154 8/1990 United Kingdom .

OTHER PUBLICATIONS

Jerry C. Whitaker, "The Electronics Handbook", 1996, Technical Press, Inc. (Beaverton, Oregon), pg. 1170–1172, Especially p. 1171.

*Primary Examiner*—Siegfried H. Grimm
*Attorney, Agent, or Firm*—Steven R. Biren

[57] ABSTRACT

An oscillator is formed by a resonator (RES) coupled to an amplifier (AMP) via a coupling path (COP). In order to counter unwanted oscillations due to parasitic resonances in the coupling path (COP), the coupling path (COP) includes a series resistance (RS). This allows better performance in terms of noise for countering unwanted oscillations, despite the fact that the series resistance is in itself a source of noise. An even better noise-performance is obtained if the coupling path (COP) also includes a series capacitance. Such a series capacitance will also effectively widen a frequency range over which the oscillator can be tuned.

2 Claims, 3 Drawing Sheets

OSCILLATOR HAVING A RESONATOR COUPLED TO AN AMPLIFIER BY A SERIES RESISTANCE

BACKGROUND OF THE INVENTION

1. Field of the Invention

The invention relates to an oscillator which is formed by a resonator coupled to an amplifier. The oscillator may be used, for example, in a receiver for providing a mixing carrier in a VHF and/or a UHF-band.

2. Description of the Related Art

U.S. Pat. No. 5,434,544 (attorney's docket PHN 14,570) describes an oscillator including a resonator which is coupled to an amplifier stage. This document states that a practical resonator generally has different resonance frequencies because elements of the resonator comprise unwanted reactances. For example, an LC circuit provided with varicap diodes for use in a UHF television tuner has three resonance frequencies, one of which is desired and the other two are parasitic.

To inhibit oscillation at an unwanted frequency, the following is proposed. The amplifier stage comprises an amplifier transistor, an output current of which flows into the emitter of a load transistor via a load signal path. The amplifier stage acquires a bandpass characteristic by a passive capacitive bootstrap signal transfer from this signal path to the base of the load transistor. The oscillator thus preferably oscillates within the passband of the amplifier stage. Unwanted oscillations are inhibited by adjusting the passband of the amplifier stage near the desired oscillation frequency.

SUMMARY OF THE INVENTION

It is an object of the invention to provide an oscillator of the above-identified type which, with respect to the background art, allows a better performance in terms of noise.

The above object is achieved in an oscillator which is formed by a resonator coupled to an amplifier via a coupling path, characterized in that the coupling path includes a series resistance.

The above object is further achieved in a receiver including the above oscillator.

The invention takes the following aspects into consideration. In any practical oscillator implementation, parasitic reactances will be comprised not only in the resonator itself, but also in a coupling path between the resonator and the amplifier. For example, if the amplifier is implemented as an integrated circuit, the coupling path will include bonding wires and lead frames which constitute parasitic inductances. It will also include bonding and package pads which constitute parasitic capacitances. In any case, parasitic reactances comprised in the coupling path between the resonator and the amplifier will cause parasitic resonances. Such a parasitic resonance, which will be referred to as parasitic coupling-path resonance hereinafter, may be dominant over the desired resonance provided by the resonator. Moreover, the parasitic coupling-path resonance may be close in frequency to the desired resonance, particularly if the oscillator operates at relatively high frequencies, for example, of the order of 1 GHz, and/or if the oscillator is tunable.

In the background art, unwanted oscillations are countered by the bandpass characteristic of the amplifier which favors the desired resonance over any parasitic resonance. The bandpass characteristic needs to be relatively sharp if a parasitic coupling-path resonance is dominant over the desired resonance and, in particular, if the parasitic coupling-path resonance is close in frequency to the desired resonance. To make the bandpass characteristic sharp, the positive feedback loop in the amplifier, which is formed by the load transistor and the passive capacitive bootstrap signal transfer, needs to have a gain which approximates the value one (1) relatively closely. However, in that case, the noise of the load transistor, which is effectively within the positive feedback loop, will be amplified to a relatively large extent. Consequently, in the background art, countering unwanted oscillations is accompanied by a penalty in terms of noise performance. The penalty can be particularly severe if a parasitic coupling-path resonance is dominant and, moreover, close in frequency to the desired resonance.

In accordance with the invention, the coupling path between the resonator and the amplifier includes a series resistance. It has been found that such a series resistance damps parasitic coupling-path resonances to a significantly greater extent than the desired resonance. Consequently, the amplifier does not need to have a relatively sharp bandpass characteristic in order to counter unwanted oscillations. Consequently, if the amplifier comprises a load transistor included in a positive feedback loop for realizing a bandpass characteristic, this loop does not need to have a gain which closely approximates the value one (1). Because of this, the noise of the load transistor will be amplified to a significantly lesser extent than in the background art. The series resistance included in the coupling path may even damp parasitic coupling-path resonances to such an extent that the amplifier does not need to have a bandpass characteristic in order counter unwanted oscillations. In that case, the amplifier will not need a load transistor included in a positive feedback loop. Instead, a less noisy load circuit can be used such as, for example, a sole resistance.

In any case, the invention allows the amplifier of the oscillator to have significantly better noise properties than in the background art. This provides a beneficial effect on the oscillator's noise performance which has to be weighed against an adverse effect because the series resistance included in the coupling path constitutes a source of noise itself. It has been found that, in many applications, the beneficial effect substantially outweighs the adverse effect. Thus, the invention allows an oscillator which, with respect to the background art, has a better performance in terms of noise.

Another advantage of the invention is as follows. The oscillator's performance also depends on the gain in an oscillation loop of which the amplifier and the resonator form part. If the oscillation loop-gain is too small, the oscillator may not oscillate. If the oscillation loop-gain is too large, transistors in the amplifier may saturate, which will adversely affect an oscillation signal. In practice, the oscillation loop-gain will vary if the resonator is tuned and, consequently, the performance will not be constant. It has been found that, in many applications, the series resistance in the coupling path between the resonator and the amplifier effectively reduces variations in the oscillation loop-gain as a result of tuning. Consequently, the invention also contributes to the oscillator having a performance which is substantially constant throughout the desired tuning range.

The invention may be wholly or partially implemented as an integrated circuit. For example, the integrated circuit may comprise the oscillator's amplifier including a positive feedback path. The oscillator's resonator may be external and coupled to the positive feedback path. An advantage of such an implementation is that it is cost-efficient because the integrated circuit has to be provided with relatively few pins and external components for coupling the resonator to the amplifier. It should be noted that, in such a cost-efficient implementation, there would be a potential risk of unwanted oscillations if the coupling path between the resonator and the amplifier were not provided with a series resistance as in the invention. Thus, the invention allows an integrated-circuit implementation which is both reliable and cost-efficient.

The invention may be applied in a receiver which comprises a mixer for converting a reception signal to an intermediate frequency. An oscillator will be needed for supplying a mixing carrier to the mixer. Since the invention allows the oscillator to be implemented in an integrated-circuit form which is both reliable and cost-efficient, it contributes to a modest cost-price of the receiver. Furthermore, since the invention allows the oscillator to have a relatively good noise performance, it also contributes to a satisfactory quality of reception. The aforementioned advantages make the invention particularly suitable for use in digital receivers such as, for example, digital video broadcast (DVB) receivers.

The invention and additional features, which may be optionally used to implement the invention to advantage, are apparent from and will be elucidated with reference to the drawings described hereinafter.

DESCRIPTION OF THE PREFERRED EMBODIMENTS

First, some remarks will be made on the use of reference signs. Similar entities are denoted by an identical letter-code throughout the drawings. Various similar entities may be shown in a single drawing. In that case, a numeral is added to the letter-code to distinguish similar entities from each other. The numeral will be in parentheses if the number of similar entities is a running parameter.

Figure 1:
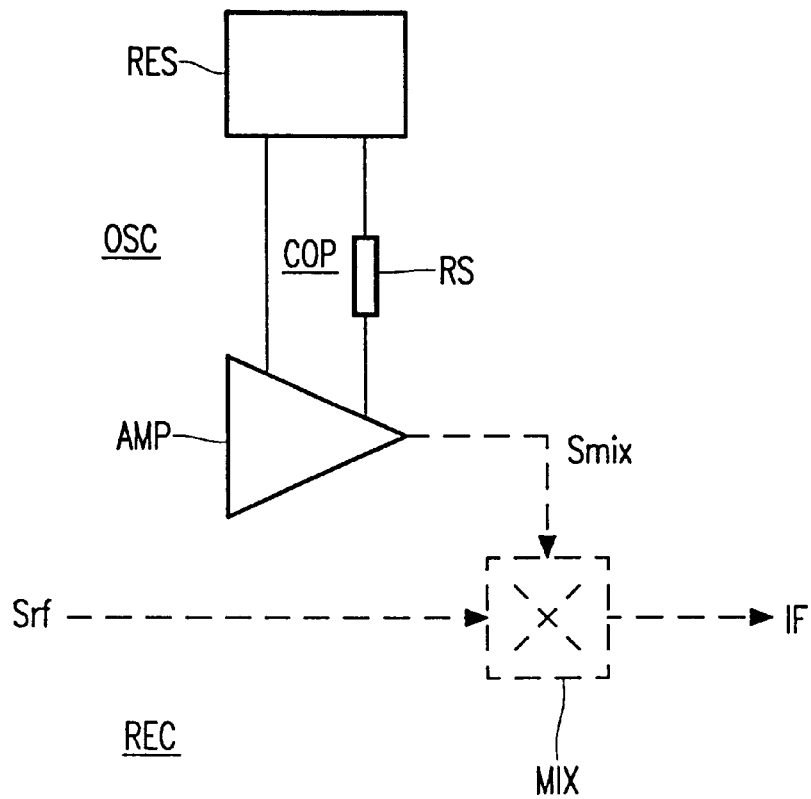
FIG. 1 is a conceptual diagram illustrating basic features of the invention.

FIG. 1 illustrates basic features of the invention in solid lines. An oscillator OSC is formed by a resonator RES coupled to an amplifier AMP via a coupling path COP. The coupling path includes a series resistance RS.

FIG. 1 also illustrates the following in broken lines. The oscillator OSC forms part of a receiver REC. It provides a mixing carrier Smix to a mixer MIX for converting a reception signal Srf to an intermediate frequency IF.

Figure 2:
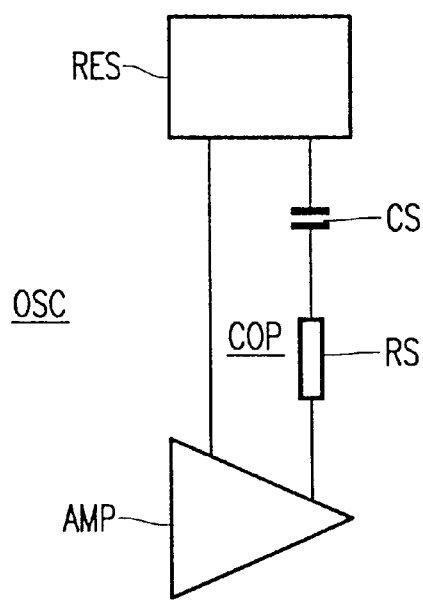
FIG. 2 is a conceptual diagram illustrating additional features of the invention.

FIG. 2 illustrates the following additional feature. The coupling path COP between the resonator RES and the amplifier AMP also includes a series capacitance CS. The FIG. 2 feature is based on the following consideration. The noise performance of the oscillator depends on the phase-frequency characteristic of the resonator RES when coupled to the amplifier AMP. The steeper the phase-frequency characteristic is near the desired resonance, the better the noise performance will be. The series capacitance CS effectively increases the steepness of the phase-frequency characteristic. Consequently, the series capacitance CS contributes to a further improved noise performance.

Another advantage of the FIG. 2 feature is as follows. The oscillator may be required to be tunable. In practice, a tunable oscillator is realized by providing the resonator with an electrical component having a reactance which is adjustable, for example by means of a tuning control voltage. A tuning range of the oscillator is determined not only by the extent to which the reactance of this electrical component can be adjusted, but also by the oscillator's structure and the properties of the other electrical components comprised therein. If the series capacitance CS is included in the coupling path between the resonator RES and the amplifier AMP, as shown in FIG. 2, the tuning range will generally be wider than in the case where it is not included. Thus, the FIG. 2 feature allows the oscillator to be tuned throughout a relatively wide frequency range.

Figure 3:
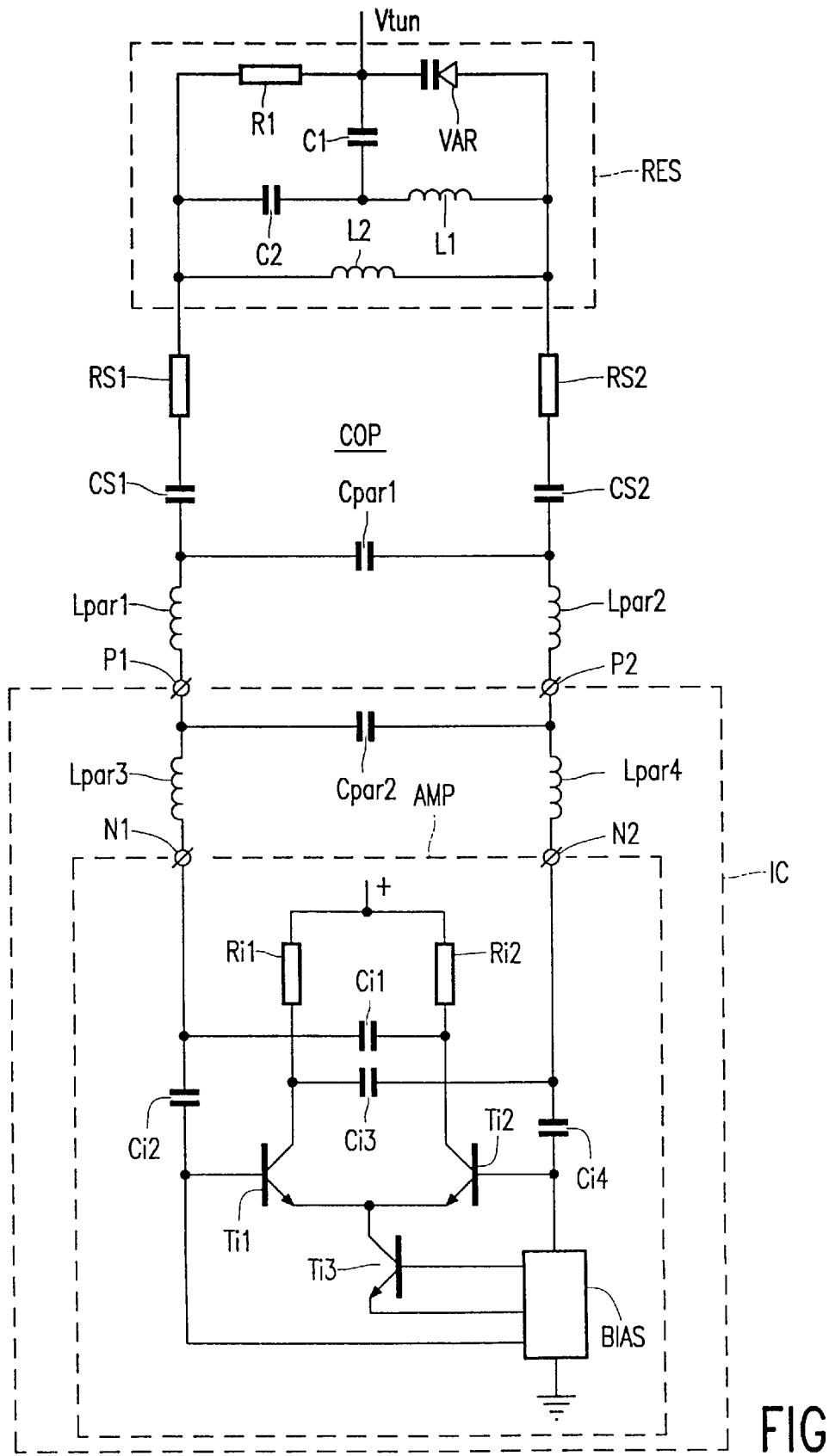
FIG. 3 is a circuit diagram of an example of an oscillator in accordance with the invention.

FIG. 3 illustrates an example of an oscillator in accordance with the invention which includes the FIG. 1 and FIG. 2 features described hereinbefore. In the FIG. 3 oscillator, the amplifier AMP forms part of an integrated circuit IC and comprises a positive feedback path in the form of integrated capacitances Ci1–Ci4. It also comprises three integrated transistors Ti1–Ti3, two integrated resistances Ri1, Ri2 and integrated biasing circuitry BIAS for supplying bias voltages to the integrated transistors Ti1–Ti3. The resonator RES is formed by two inductors L1 and L2, two capacitors C1 and C2, a resistor R1, and a varactor VAR to which a tuning voltage Vtun may be applied. The resonator RES is coupled to nodes N1, N2 of the amplifier AMP via the coupling path COP.

In the FIG. 3 oscillator, the coupling path COP comprises a pair of series resistances RS1, RS2 and a pair of series capacitances CS1, CS2. Furthermore, it comprises some parasitic capacitances Cpar and parasitic inductances Lpar. Parasitic capacitance Cpar1 may be, for example, due to a capacitive coupling between two tracks on a printed circuit board. Parasitic capacitance Cpar2 may be, for example, due to a capacitive coupling between two connection pins P1, P2 of the integrated circuit IC which form part of the coupling path COP. Parasitic inductances Lpar1, Lpar2 may be, for example, formed by the lead frame of the integrated circuit IC and parasitic inductances Lpar3, Lpar4 may be formed by bonding wires.

The manner in which the FIG. 3 oscillator operates may be explained as follows. The resonator RES and the coupling path COP constitute an impedance between the nodes N1 and N2. The amplifier AMP also constitutes an impedance between these nodes. Each of the two aforementioned impedances may be regarded as a parallel connection of a resistance and a reactance. The oscillator may potentially oscillate at a frequency for which the two following conditions are satisfied. First, the reactances of the two impedances must be opposite in sign and equal in value. Secondly, the resistance constituted by the resonator RES and the coupling path COP, which will be called tank resistance hereinafter, must have a value which is larger than the absolute value of the resistance constituted by the amplifier AMP. The tank resistance has a negative sign and effectively un-damps the resonator RES. Therefore, it will be referred to as undamping resistance hereinafter. It should be noted that, in the FIG. 3 oscillator, the value of the undamping resistance is substantially frequency-independent, which is not the case in the oscillator described in U.S. Pat. No. 5,434,544 (attorney's docket PHN 14,570). The latter oscillator has an amplifier which provides an undamping resistance whose value is frequency-dependent.

In TV applications of the FIG. 3 oscillator, favorable results can be obtained with the series resistances RS1 and RS2 being of the order of ten ohms. For example, the FIG. 3 oscillator was applied for tuning in the VHF-A, VHF-B and UHF bands with the series resistances RS1 and RS2 being 47, 27 and 15 ohms, respectively. The series capacitances CS1 and CS2 are preferably of the order of a few picofarads. With these values, tuning in the UHF band can be extended from a maximum of approximately 900 MHz, if no series capacitances are used, to approximately 1070 MHz. Furthermore, since the series capacitances CS1 and CS2 also effectively widen the tuning range in the VHF-A and VHF-B bands, the implementation of the resonator RES is less critical. That is, the elements of the resonator RES have to meet less stringent requirements in terms of component spread in order to tune throughout the entire VHF-A and VHF-B bands. Furthermore, for any of the aforementioned bands, the series capacitances CS1 and CS2 provided an appreciable improvement in terms of noise.

Figure 4A:
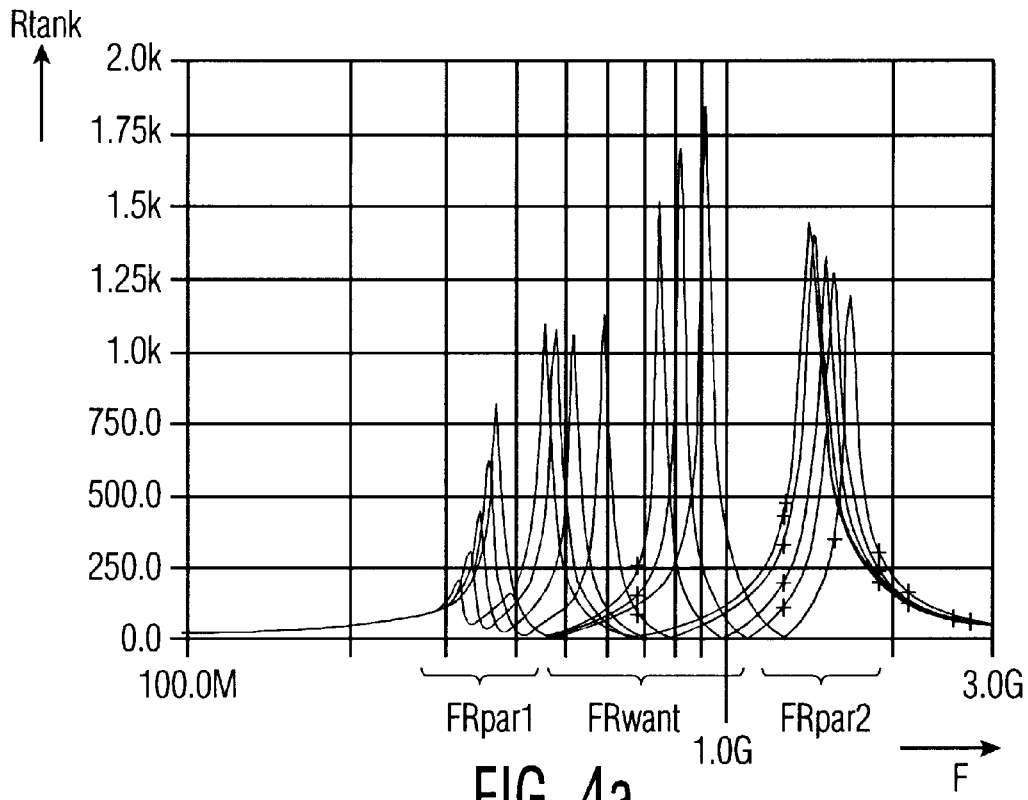
FIGS. 4a and 4b are diagrams illustrating the effect of series resistances in the FIG. 3 oscillator.
Figure 4B:
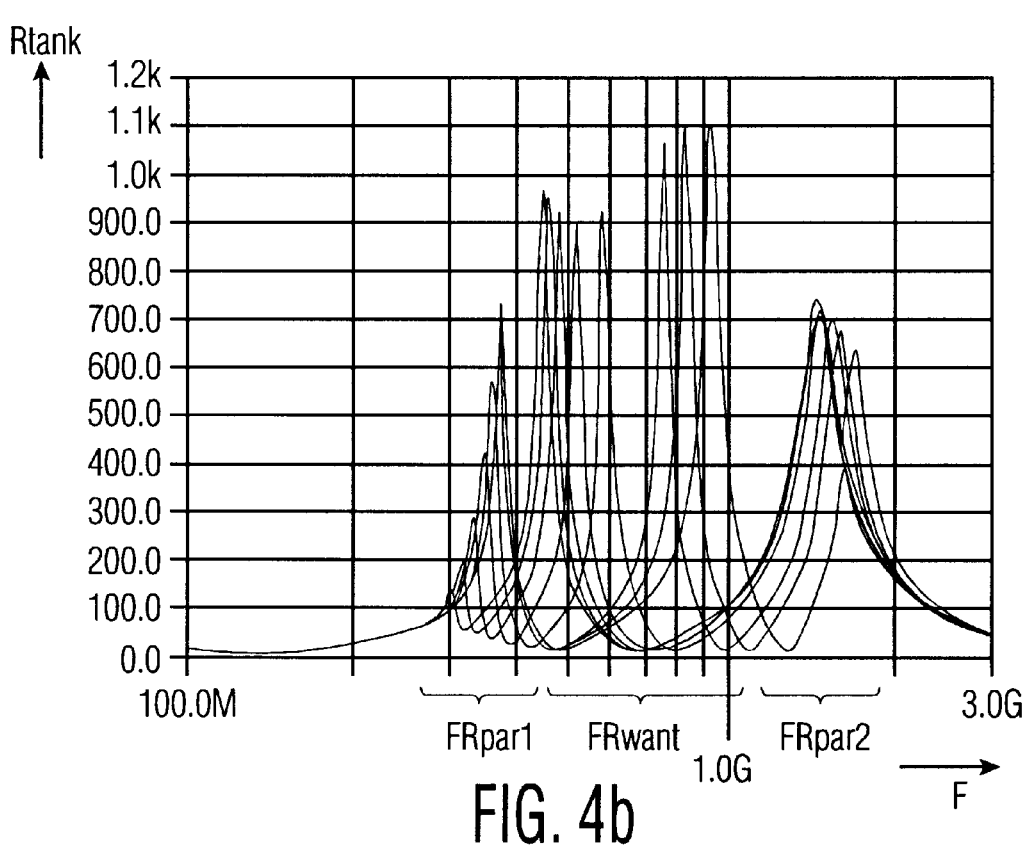

FIGS. 4a and 4b illustrate the effect of the series resistances RS1, RS2 in the coupling path COP between the resonator RES and the amplifier AMP. Both Figures show the tank resistance (Rtank) between the nodes N1 and N2 as a function of frequency (F) for various tuned states of the resonator RES. FIG. 4a is obtained when the series resistance RS has zero value, i.e., it is absent, and FIG. 4b is obtained when the series resistance RS has a value of 5 ohms. In both Figures, there is one frequency range FRwant in which the desired resonance may be located and two frequency ranges FRpar1 and FRpar2 in which parasitic resonances may be located. It should be noted that the resonator RES has been designed for a UHF TV-application of the FIG. 3 oscillator.

In FIG. 4a, the tank resistance may be higher at a parasitic resonance frequency in the frequency range FRpar2 than at a desired resonance frequency in the frequency range FRwant. In order to satisfy the oscillation conditions at the desired resonance frequency, the undamping resistance constituted by the amplifier AMP must have an absolute value which is smaller than that of the tank resistance. However, in that case, the absolute value of the undamping resistance will certainly be smaller than the tank resistance at the parasitic resonance frequency. Consequently, there is a risk that the oscillator OSC will oscillate at the parasitic resonance frequency, rather than at the desired resonance frequency.

In FIG. 4b, the tank resistance is always higher at a desired resonance frequency in the frequency range FRwant than at a parasitic resonance in any of the frequency ranges FRpar1 and FRpar2. The amplifier AMP can be designed in such a way that the undamping resistance has an absolute value which is smaller than the tank resistance at the desired resonance frequency but larger than the tank resistance at any parasitic resonance frequency. In that case, the oscillation conditions can be satisfied at the desired resonance frequency only. However, even if the undamping resistance has an absolute value which is lower than the tank resistance at a parasitic resonance frequency, the oscillator will preferably oscillate at the desired resonance frequency because the tank resistance is higher at this frequency.

CLOSING REMARKS

The drawings and their description hereinbefore illustrate rather than limit the invention. It will be evident that there are numerous alternatives which fall within the scope of the appended Claims. In this respect, the following closing remarks are made.

There are numerous ways of physically spreading functions or functional elements over various units. In this respect, the drawings are very diagrammatic, each representing only one possible embodiment of the invention.

What is claimed is:

1. An oscillator (OSC) which is formed by a resonator (RES) coupled to an amplifier (AMP) via a coupling path (COP), characterized in that the coupling path (COP) comprises two conductors, each having a series capacitance (CS) connected in series with a series resistance (RS).

2. A receiver comprising a mixer for converting a reception signal to an intermediate frequency, and an oscillator as claimed in claim 1 for providing a mixing carrier to the mixer.

* * * * *